(12) United States Patent
Takahashi

(10) Patent No.: US 6,586,947 B2
(45) Date of Patent: Jul. 1, 2003

(54) METHOD AND DEVICE FOR INSPECTING A MICROACTUATOR

(75) Inventor: Yoshikzu Takahashi, Kusatsu (JP)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/005,401

(22) Filed: Dec. 5, 2001

(65) Prior Publication Data

US 2002/0121908 A1 Sep. 5, 2002

(30) Foreign Application Priority Data

Dec. 6, 2000 (JP) ........................................ 2000-371874

(51) Int. Cl.[7] .............................................. G01R 27/26
(52) U.S. Cl. ........................................ 324/661; 324/661
(58) Field of Search ................................. 324/661, 662, 324/667, 672, 660, 207.25, 207.11; 73/1.79, 514.32; 360/69, 75, 77.01, 77.02, 86, 97.01, 110, 73.01, 254, 260

(56) References Cited

U.S. PATENT DOCUMENTS

| 6,219,193 B1 | * | 4/2001 | Janz .............................. 360/55 |
| 6,282,052 B1 | * | 8/2001 | Galloway et al. ........ 360/78.09 |
| 6,421,207 B1 | * | 7/2002 | Sato ........................ 360/246.4 |

* cited by examiner

*Primary Examiner*—Christine Oda
*Assistant Examiner*—Amy He
(74) *Attorney, Agent, or Firm*—Robert B. Martin; Bracewell & Patterson, L.L.P.

(57) ABSTRACT

A current value of each second harmonic content is measured while changing a frequency of an AC drive voltage applied to comb capacitors within a specified range. A frequency-current value characteristic is obtained for the second harmonic content, and the obtained characteristic is substituted with the vibration frequency-velocity characteristic of a microactuator.

18 Claims, 13 Drawing Sheets

$$m \cdot \frac{d\,x^2}{d\,t^2} + c\frac{d\,x}{d\,t} + k \cdot x = F_0 \cdot \sin\omega t \quad \cdots (1)$$

$$x = A \cdot \sin\omega t \qquad \cdots\cdots (2)$$

$$A = \frac{\frac{F_0}{k}}{\sqrt{\left\{1-\left(\frac{\omega}{\omega_n}\right)^2\right\}^2 + \left(\frac{2\zeta}{\omega_n}\right)^2}} \qquad \cdots\cdots (3)$$

$$v = A \cdot \omega \cdot \cos\omega t \qquad \cdots (4)$$

INTRINSIC ANGULAR FREQUENCY $\quad \omega_n = \sqrt{\frac{k}{m}} \qquad \cdots (5)$ DAMPING RATIO $\quad \zeta = \frac{c}{2\sqrt{m \cdot k}} \qquad \cdots (6)$

*Fig. 8*

$$i = i_1 + i_2 = \frac{d}{dt}Q_1 + \frac{d}{dt}Q_2$$

$$= \frac{d}{dt}\{C_1(V_0 + Vd_1 \cdot \sin\omega t)\}$$

$$+ \frac{d}{dt}\{C_2(V_0 - Vd_2 \cdot \sin\omega t)\} \quad \cdots (11)$$

$$C_1 = C_0 - C_x \quad \cdots\cdots (12)$$

$$C_2 = C_0 + C_x \quad \cdots\cdots (13)$$

$$i = \frac{d}{dt}\{(C_0 - C_x)(V_0 + Vd_1\sin\omega t)\}$$

$$+ \frac{d}{dt}\{(C_0 + C_x)(V_0 - Vd_2\sin\omega t)\} \quad \cdots (14)$$

$$= \frac{d}{dt}\{2C_0V_0 + C_0(Vd_1 - Vd_2)\sin\omega t$$

$$- C_x(Vd_1 + Vd_2)\sin\omega t\} \quad \cdots (15)$$

*Fig. 10*

$$Cx = L_0 \cdot A \cdot \sin\omega t \qquad \cdots (21)$$

$$i = \frac{d}{dt}\{2C_0 V_0 + C_0(Vd_1 - Vd_2)\sin\omega t \\ - L_0 \cdot A \cdot \sin\omega t (Vd_1 + Vd_2)\sin\omega t)\} \qquad \cdots (22)$$

$$= \frac{d}{dt}\{2C_0 V_0 + C_0(Vd_1 - Vd_2)\sin\omega t \\ - L_0 \cdot A(Vd_1 + Vd_2)\sin^2\omega t)\} \qquad \cdots (23)$$

FIRST TERM: $\quad \frac{d}{dt}(2 \cdot C_0 \cdot V_0) = 0 \qquad \cdots (24)$

SECOND TERM: $\quad \frac{d}{dt}(C_0(Vd_1 - Vd_2)\sin\omega t \qquad \cdots (25)$ $$= C_0(Vd_1 - Vd_2)\omega \cos\omega t \qquad \cdots (26)$$

THIRD TERM: $\quad \frac{d}{dt}\{L_0 \cdot A(Vd_1 + Vd_2)\sin^2\omega t\} \qquad \cdots (27)$ $$= \frac{d}{dt}\frac{L_0 \cdot A(Vd_1 + Vd_2)(1 - \cos 2\omega t)}{2} \qquad \cdots (28)$$

$$= \frac{L_0 \cdot A(Vd_1 + Vd_2) \cdot 2\omega \cdot \sin 2\omega t}{2} \qquad \cdots (29)$$

*Fig. 11*

$$i = C_0(Vd_1 - Vd_2) \cdot \omega \cdot \cos\omega t$$
$$+ \frac{L_0(Vd_1 + Vd_2) \cdot A \cdot 2\omega \cdot \sin 2\omega t}{2} \quad \cdots (31)$$

$$i_{base} = C_0(Vd_1 - Vd_2) \cdot \omega \cdot \cos\omega t \quad \cdots (32)$$

$$i_{2nd} = L_0(Vd_1 + Vd_2) \cdot A \cdot \omega \cdot \sin 2\omega t \quad \cdots (33)$$

$$i_{base} = C_0(Vd_1 - Vd_2)\omega \quad \cdots (34)$$

$$i_{2nd} = L_0(Vd_1 + Vd_2) \cdot A \cdot \omega \quad \cdots (35)$$

$$= \frac{\frac{F_0}{k} \cdot L_0(Vd_1 + Vd_2)\omega}{\sqrt{\left\{1 - \left(\frac{\omega}{\omega_n}\right)^2\right\}^2 + \left(\frac{2\zeta}{\omega_n}\right)^2}} \quad \cdots (36)$$

*Fig. 12*

$$C_0(Vd_1 - Vd_2) \quad \cdots\cdots (41)$$

$$\omega_0 = \sqrt{(1-2\zeta^2)} \cdot \omega_n \quad \cdots\cdots (42)$$

$$\omega_n = \sqrt{\frac{k}{m}} \quad \cdots\cdots (43)$$

$$\text{DAMPING RATIO} \quad \zeta = \frac{C}{2\sqrt{m \cdot k}} \quad \cdots\cdots (44)$$

*Fig. 13*

METHOD AND DEVICE FOR INSPECTING A MICROACTUATOR

This application claims the priority benefit of Japanese patent application No. 2000-371874, filed on Dec. 6, 2000, and entitled "Method and Device for Inspecting Microactuator."

BACKGROUND OF THE INVENTION

1. Technical Field

The present invention relates to a method and a device for inspecting a microactuator used for tracking control of a magnetic head in, for example, a hard disk device, and more particularly, the present invention relates to a method and a device capable of inspecting mechanical characteristics of the microactuator by using an inexpensive measuring device.

2. Description of the Related Art

In a conventional hard disk device, a base end side of a suspension is rotatably supported such that its tip side can be freely displaced in a radial direction of a disk, the disk being a recording medium. A magnetic head for reading/writing data is attached to a tip portion of the suspension, and a swinging position of the suspension is controlled by a driving current applied to a voice coil motor so that the magnetic head can move to a position corresponding to a desired track of the disk. However, since intervals between track pitches are reduced in the hard disk device due to a larger capacity of the same, controlling the swinging position of a suspension arm alone has been becoming insufficient for tracking the magnetic head well while the disk spins. Accordingly, to align the magnetic head with the track on the disk, addition of microactuator control to swing control of the suspension has been suggested.

There are few micromachine products which have been put to practical use. For inspection of frequency-velocity characteristics of the micromachine, the majority of what has been presented so far uses expensive measuring systems at a research level, and no low-cost, highly reliable, and high-throughput measuring systems aiming at mass production have not been presented. However, possible technologies and their problems regarding methods for inspecting the frequency-velocity characteristics of a comb microactuator are as follows:

(a) A side face of the comb microactuator is irradiated by a laser beam, and velocity of the comb microactuator is measured using pitch shifting of a reflected light. In this inspecting method, an expensive measuring device such as an in-plane vibration laser Doppler velocimeter (LDV) or the like is required. Also, it is difficult to perform a parallel measurement, in which a plurality of comb microactuators are subjected to the measurement simultaneously.

(b) A high frequency of 60 MHz from a pulse generator is superposed on the drive voltage (2 kHz to 200 kHz) of the comb microactuator, and power discharged to the ground through the capacitor is measured. In this inspecting method, a high-frequency circuit becomes complex, the number of components is increased, and reliability is reduced. Also, highly accurate substrate designing is required.

(c) A vibration state of the comb microactuator captured through a microscope is subjected to image processing, and amplitude thereof is measured. Also in this inspecting method, a measuring device becomes expensive, and it is difficult to perform a parallel measurement, in which the frequency-velocity characteristics of the plurality of comb microactuators are subjected to the measurement simultaneously. Moreover, a large burden is imposed on program development.

(d) The comb microactuator receives a drive voltage to be displaced, and while being displaced, a capacity measurement is performed. In this inspecting method, since fluctuation of about 20% of a 3 pF capacity is measured, a highly accurate measuring system is necessary. The capacity measurement also takes time, and only a static state of the comb microactuator can be inspected.

SUMMARY OF THE INVENTION

Thus, it is an object of the present invention to provide a method and a device for inspecting a microactuator capable of inspecting mechanical characteristics without using an expensive device such as a laser measuring device or the like.

A microactuator inspecting method according to a first aspect of the invention is characterized in that a capacitor is provided, having both poles thereof being freely displaced relative to each other with respect to an AC drive voltage, which displaces a specified object based on relative movements of both of the poles of the capacitor. Such microactuator inspecting method comprises the steps of: supplying the AC drive voltage to the capacitor while changing a frequency thereof within a specified range; detecting a current value regarding a specified harmonic content with respect to each frequency of the AC drive voltage from a current of the capacitor; detecting a relation between a frequency fa and a current value I of the specified harmonic content as a first electric characteristic fa-I of the microactuator; and determining whether a mechanical characteristic of the microactuator is good or bad based on the first electric characteristic fa-I of the microactuator.

A range in which the frequency of the AC drive voltage supplied to the capacitor of the microactuator changes is, for example, from 1 kHz to 40 kHz, and generally in a range from 2 kHz to 20 kHz. In a typical microactuator, a plurality of capacitors are provided and are connected in parallel. Movable electrodes of all the capacitors are linked so as to be displaced integrally.

The current value of the harmonic content is detected by using, for example, a fast Fourier transformer (FFT) or the like. The FFT is not expensive, and provided for example in a general digital oscilloscope. Change in frequency includes both continuous change and discontinuous change by a specified amount when the frequency of the AC drive voltage changes within a specified range.

With regard to the capacitor used as a driving source to displace the object, a specified correspondence between the mechanical characteristic thereof and the first electric characteristic has been discovered by the inventors of the present invention, as described later. According to the first aspect of the present invention, it is possible to determine whether the mechanical characteristic of the capacitor is good or bad by investigating the first electric characteristic that can be measured using an inexpensive measuring device, instead of by inspecting the mechanical characteristic requiring the use of an expensive measuring device.

The general digital oscilloscope has a plurality of input channels. By inputting each current of the capacitor of each of a plurality of microactuators to each input channel of the digital oscilloscope, it is possible to enhance inspection efficiency by simultaneously inspecting the mechanical characteristic of the plurality of microactuators. When directly measuring the mechanical characteristic by an in-plane vibration laser Doppler velocimeter (LDV), it is difficult to simultaneously inspect the mechanical characteristic of a plurality of chips of microactuators arrayed in a grid form.

The microactuator inspecting method according to a second aspect of the present invention is characterized in that, in the microactuator inspecting method of the first aspect, the specified harmonic content is a second harmonic content.

The microactuator inspecting method according to a third aspect of the present invention is characterized in that, in the microactuator inspecting method of the first or the second aspect in the first electric characteristic fa-I, the frequency fa is converted into a frequency fb by fa·(1/a multiple of a harmonic), a second electric characteristic fb-I is detected at the same time with a current value of each fb regarded as a current value I of the fa corresponding to the fb, and whether a mechanical characteristic of the microactuator is good or bad is determined based on the second electric characteristic fb-I.

The multiple of the harmonic means a frequency of a harmonic or of a frequency of a fundamental wave. For example, if the fundamental wave is 2 kHz and the second harmonic is selected as a harmonic, the multiple of the harmonic is 4 kHz/2 kHz=2. Thus, if the specified harmonic content is the second harmonic, fb=fa/2 is established, fb being the frequency of the fundamental wave.

A frequency for the mechanical characteristic is usually related not to the harmonic but to the fundamental wave frequency. By determining whether the mechanical characteristic of the microactuator is good or bad based on the second electric characteristic f2-I, the correspondence with the mechanical characteristic of the capacitor becomes clearer.

The microactuator inspecting method according to a fourth aspect of the present invention is characterized in that, in the microactuator inspecting method of any one of the first to the third aspects, the mechanical characteristic is a frequency-velocity characteristic.

The microactuator inspecting method according to a fifth aspect of the present invention is characterized in that, in the microactuator inspecting method of any one of the first to the fourth aspects, whether the mechanical characteristic of the microactuator is good or bad is determined by comparing the mechanical characteristic corresponding to the first electric characteristic fa-I with a reference mechanical characteristic of the microactuator.

In the comparison between the mechanical characteristic corresponding to the first electric characteristic fa-I and the reference mechanical characteristic of the microactuator, a velocity peak value, a frequency at the velocity peak value, shapes of both sides of a peak in a characteristic line and the like are selected to be compared, for example, and whether the mechanical characteristic of each microactuator is good or bad is determined based on the above selected items.

The microactuator inspecting method according to a sixth aspect of the present invention is characterized in that, in the microactuator inspecting method of any one of the first to the fifth aspects, the microactuator includes a substrate, a stage rotatably supported on the substrate, and a plurality of capacitors disposed at appropriate intervals along peripheries of the stage. Each of the capacitors includes fixed electrodes fixed to the substrate, and a movable electrode fixed to the stage, which is freely displaced relative to the fixed electrodes, and change in the AC drive voltage to the capacitor causes the stage to change a rotational position thereof with respect to the substrate. The stage should preferably freely rotate with respect to the substrate while being placed above the substrate without sliding into contact with the same.

The microactuator inspecting method according to a seventh aspect of the present invention is characterized in that, in the microactuator inspecting method of the sixth aspect, the fixed and movable electrodes have pluralities of comb-tooth portions and are disposed in a manner that own comb-tooth portion is partially inserted between two adjacent comb-tooth portions of an opposite side, and an amount of mutual insertion is changed by control of the AC drive voltage to the capacitor.

The microactuator inspecting method according to an eighth aspect of the present invention is characterized in that, in the microactuator inspecting method of the seventh aspect, each capacitor includes one movable electrode and two fixed electrodes disposed to sandwich the movable electrode from both sides of a displacing direction of the movable electrode.

The microactuator inspecting method according to a ninth aspect of the present invention is characterized in that, in the microactuator inspecting method of any one of the first to the eighth aspects, the capacitor is installed in a hard disk device, the hard disk device including: a suspension with a base end side thereof being supported to allow a tip side to freely move in a radial direction of a disk, the disk being a recording medium; a gimbal having a base end portion attached to the tip portion of the suspension; the microactuator having the substrate fixed to the tip portion of the gimbal; a slider fixed to a stage of the microactuator; and a magnetic head as the specified object to be displaced integrally with the stage.

With regard to the microactuator used for focusing control of the magnetic head in the hard disk device or the like, examples of dimensions and a capacitor capacity are as follows: a vertical×horizontal dimension of the substrate is 1.7 mm×2.1 mm; a height from the lower surface of the substrate to the upper surface of the stage is 0.2 mm; and the entire capacity of the capacitors connected in parallel is in a range of 2.5 pF to 3.5 pF.

A microactuator inspecting device according to a tenth aspect of the present invention provided with a capacitor having both poles thereof being freely displaced relative to each other with respect to an AC drive voltage, which displaces a specified object based on relative movements of both of the poles of the capacitor, is characterized in that the microactuator inspecting device comprises: drive voltage supplying means for supplying the AC drive voltage to the capacitor while changing a frequency thereof within a specified range; current value detecting means for detecting a current value regarding a specified harmonic content with respect to each frequency of the AC drive voltage from a current of the capacitor; first electric characteristic detecting means for detecting a relation between a frequency fa and a current value I of the specified harmonic content as a first electric characteristic fa-I of the microactuator; and determining means for determining whether a mechanical characteristic of the microactuator is good or bad based on the first electric characteristic fa-I of the microactuator.

The microactuator inspecting device according to an eleventh aspect of the present invention is characterized in that, in the microactuator inspecting device of the tenth aspect, the specified harmonic content is a second harmonic content.

The microactuator inspecting device according to a twelfth aspect of the present invention is characterized in that, in the microactuator inspecting device of the tenth or the eleventh aspect, the microactuator inspecting device further comprises: second electric characteristic detecting means for converting the frequency fa of the first electric characteristic fa-I into a frequency fb by fa(1/a multiple of a harmonic), and at the same time, detecting a second electric characteristic fb-I with a current value of each fb regarded as a current value I of the fa corresponding to the fb. The determining means determines whether a mechanical characteristic of the microactuator is good or bad based on the second electric characteristic fb-I.

The microactuator inspecting device according to a thirteenth aspect of the present invention is characterized in that, in the microactuator inspecting device of any one of the tenth to the twelfth aspects, the mechanical characteristic is a frequency-velocity characteristic.

The microactuator inspecting device according to a fourteenth aspect of the present invention is characterized in that, in the microactuator inspecting device of any one of the tenth to the thirteenth aspects, the determining means determines whether a mechanical characteristic of the microactuator is good or bad by comparing the mechanical characteristic corresponding to the first electric characteristic fa-I with a reference mechanical characteristic for the microactuator.

The microactuator inspecting device according to a fifteenth aspect of the present invention is characterized in that, in the microactuator inspecting device of any one of the tenth to the fourteenth aspects, the microactuator includes a substrate, a stage rotatably supported on the substrate, and a plurality of capacitors disposed at appropriate intervals along peripheries of the stage. Each of the capacitors includes fixed electrodes fixed to the substrate, and a movable electrode fixed to the stage, which is freely displaced relative to the fixed electrodes. Also, change in the AC drive voltage to the capacitor causes the stage to change a rotational position thereof with respect to the substrate.

The microactuator inspecting device according to a sixteenth aspect of the present invention is characterized in that, in the microactuator inspecting device of the fifteenth aspect, the fixed and movable electrodes have pluralities of comb-tooth portions, and are disposed in a manner that each comb-tooth portion is partially inserted between two adjacent comb-tooth portions of an opposite side, and an amount of mutual insertion is changed by control of the AC drive voltage to the capacitor.

The microactuator inspecting device according to a seventeenth aspect of the present invention is characterized in that, in the microactuator inspecting device of the sixteenth aspect, each capacitor includes one movable electrode and two fixed electrodes disposed to sandwich the movable electrode from both sides of a displacing direction of the movable electrode.

The microactuator inspecting device according to an eighteenth aspect of the present invention is characterized in that, in the microactuator inspecting device of any one of the tenth to the seventeenth aspects, the capacitor is installed in a hard disk device, the hard disk device including: a suspension with a base end side thereof being supported to allow a tip side to freely move in a radial direction of a disk, the disk being a recording medium; a gimbal having a base end portion attached to the tip portion of the suspension; the microactuator having the substrate fixed to the tip portion of the gimbal; a slider fixed to a stage of the microactuator; and a magnetic head as the specified object to be integrally displaced with the stage.

BRIEF DESCRIPTION OF THE DRAWINGS

The novel features believed characteristic of the invention are set forth in the appended claims. The invention itself, however, as well as a preferred mode of use, further objectives, and advantages thereof, will best be understood by reference to the following detailed description of an illustrative embodiment when read in conjunction with the accompanying drawings, wherein:

FIGS. 8(1) to 8(6) are equations regarding mechanical characteristics of the mechanical equivalent model of the microactuator.

FIGS. 10(11) to 10(15) are equations regarding the electric equivalent circuit of the-microactuator.

FIGS. 11(21) to 11(29) are equations regarding the electric equivalent circuit of the microactuator.

FIGS. 12(31) to 12(36) are equations regarding the electric equivalent circuit of the microactuator.

FIGS. 13(41) to 13(44) are equations regarding the electric equivalent circuit of the microactuator.

DETAILED DESCRIPTION OF THE PREFERRED EMBODIMENTS

Figure 1:
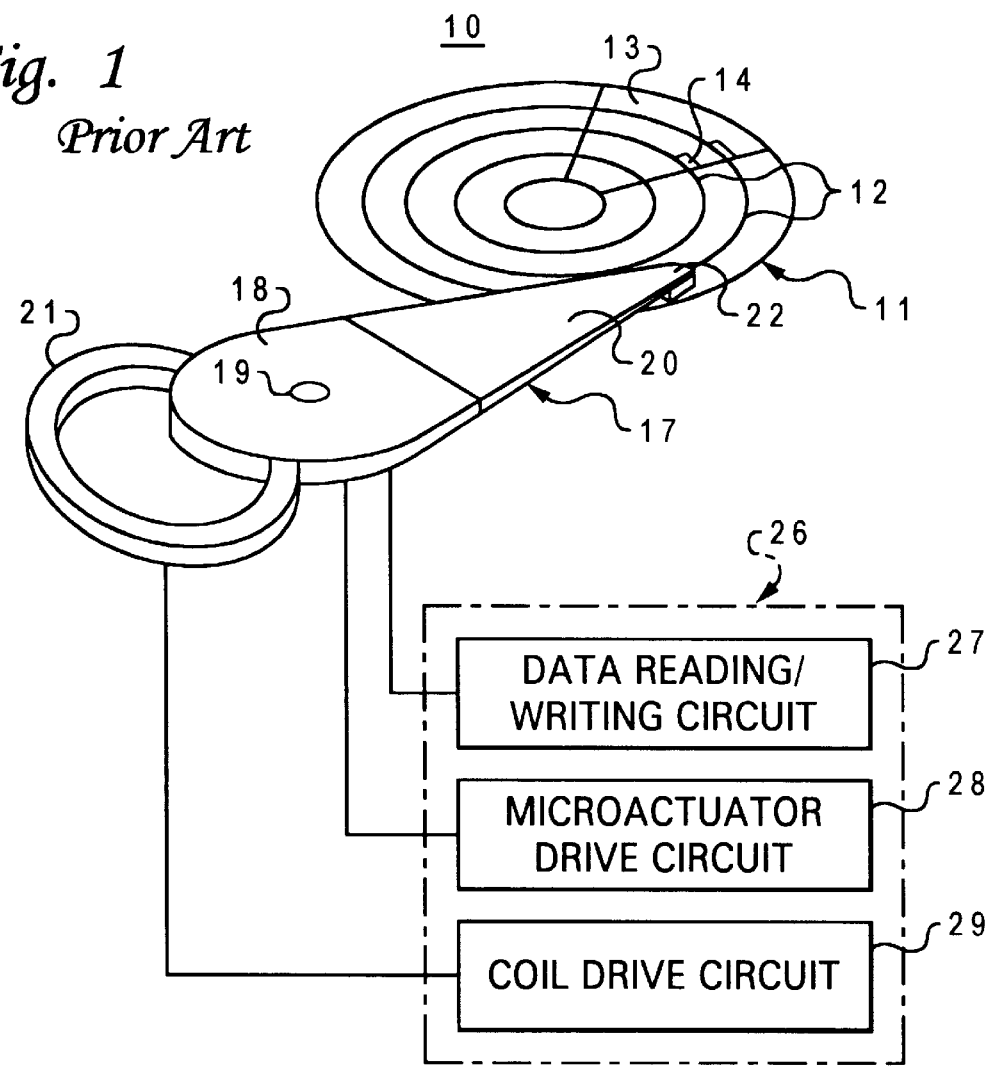
FIG. 1 is a schematic view showing main portions of a hard disk device.
Figure 2:
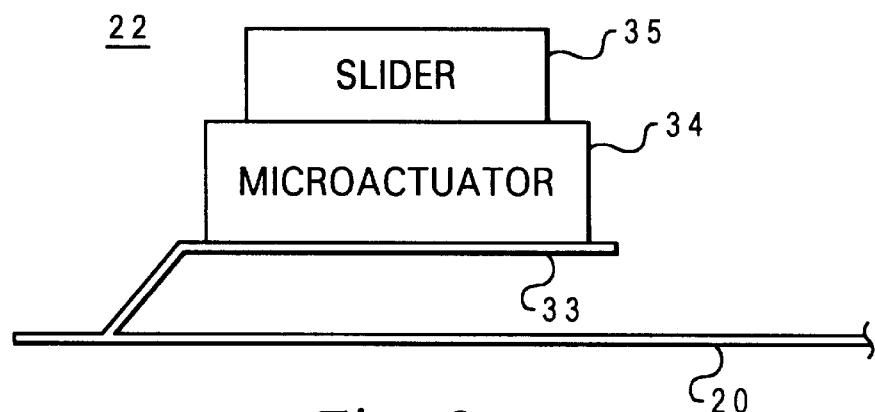
FIG. 2 is a schematic constitutional view showing a tip portion of a head device.

Hereinafter, a preferred embodiment of the present invention will be described with reference to the accompanying drawings. FIG. 1 is a schematic view showing main portions of a hard disk device 10. On a recording surface of a disk 11, a plurality of tracks 12 are arrayed at specified pitches concentrically in a radial direction. The recording surface of the disk 11 is also divided into a plurality of sectors 13 at equal angle intervals. An area 14 exists in each sector 13 of each track 12, and information for identifying the track 12 and the sector 13 is recorded in the area 14. A swinging arm 17 has an arm 18 connected to a shaft 19 so as to freely rotate around the center line of the shaft 19, and a suspension 20 which is protruding from the arm 18 toward the disk 11. A voice coil motor 21 is fixed to the arm 18 on an opposite side of the suspension 20. A head device 22 is attached to a tip portion of the suspension 20. A control circuit device 26 includes a data reading/writing circuit 27, a microactuator drive circuit 28, and a coil drive circuit 29. The data reading/writing circuit 27 outputs a data writing signal to a magnetic head 44 (FIG. 3) of the head device 22, and receives a data reading signal from the magnetic head 44. The microactuator drive circuit 28 outputs its driving signal to a microactuator 34 (FIG. 2). The coil drive circuit 29 outputs a driving signal to the voice coil motor 21. The swinging position of the suspension 20 is controlled by control of a drive voltage applied to the magnetic head 44 (FIG. 3), and the rotational direction position of the magnetic head 44 with respect to the suspension 20 is controlled by control of a drive voltage applied to the microactuator 34 (FIG. 2). In other words, for the magnetic head 44, the radial direction position of the disk 11 is roughly adjusted by control of a drive voltage applied to the voice coil motor 21 and finely adjusted by the control of the drive voltage applied to the microactuator 34, thereby drastically enhancing tracking accuracy.

FIG. 2 is a schematic constitutional view of the tip portion of the head device 22. A gimbal 33 is freely and elastically deformed, and one end thereof is fixed to the tip portion of the suspension 20. The microactuator 34 is attached to the other end of the gimbal 33. A slider 35 is attached to the microactuator 34 so as to face the recording surface of the disk 11.

Figure 3:
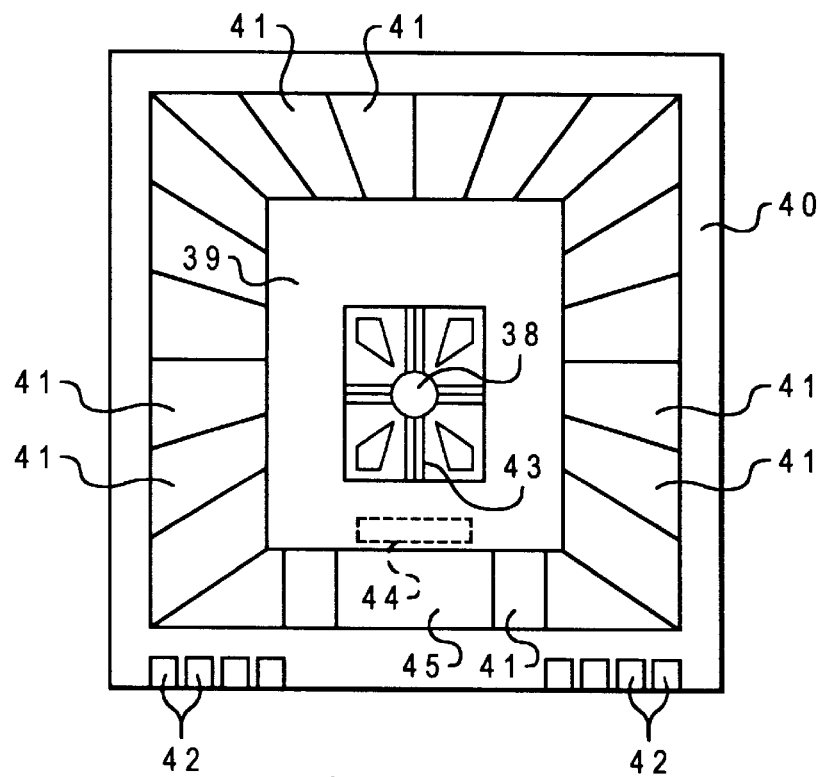
FIG. 3 is a view of a microactuator seen from a side to which a slider is attached.
Figure 4:
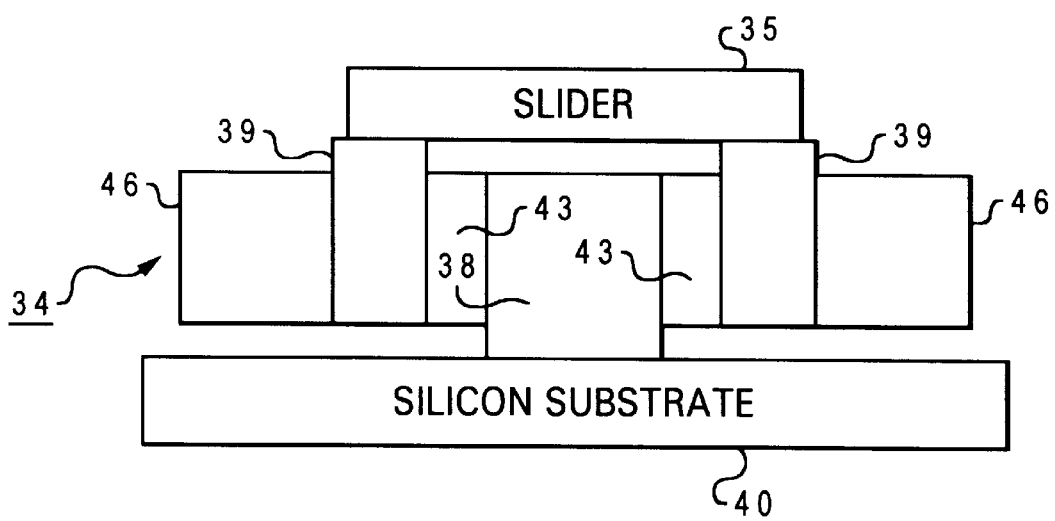
FIG. 4 is a schematic constitutional view of the microactuator seen from a side.

FIG. 3 is a view of the microactuator 34 seen from the side where the slider 35 is attached. FIG. 4 is a schematic constitutional view of the microactuator 34 seen from a side thereof. One end portion of an anchor 38 is fixed nearly at the center of a roughly squared substrate 40, and the other end portion thereof is positioned nearly at the center of a roughly squared center hole of a roughly squared stage 39. For example, groups of six plate springs 43 are located at four locations with 90-degree intervals around the anchor 38, projecting outward from the anchor 38 in a radial direction, and connect the other end portion of the anchor 38 to an inner circumference portion of the stage 39 so that the stage 39 has a specified height with respect to the substrate 40. Comb capacitors 41 surround the entire outer peripheral sides of the stage 39 except for a center range 45 at one side thereof in the vicinity of the magnetic head 44. In the range 45, a connection wiring (not shown) called a flexible wire for connecting the range 45 to the magnetic head 44 is disposed. Each comb capacitor 41 includes one movable electrode 46 (FIG. 4) fixed to the outer peripheral part of the stage 39. In FIG. 4, peripheral portions of the slider 35 are fixed to the end surface of the stage 39, and the slider 35 rotates around the anchor 38 integrally with the stage 39. Terminals 42 are provided along a specified side portion of the substrate 40, and connected to the electrode of the comb capacitor 41 and the magnetic head 44.

Figure 5:
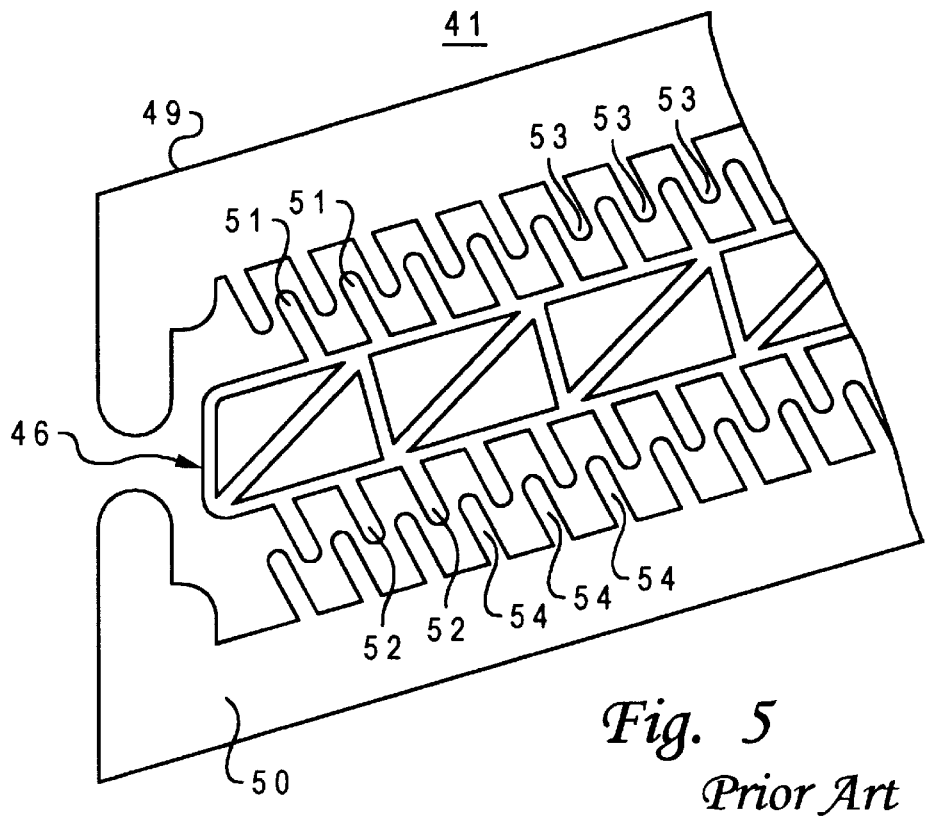
FIG. 5 is a detailed view of a comb capacitor.

FIG. 5 is a detailed view of the comb capacitor 41. The view of the comb capacitor 41 of FIG. 5 is the one seen from the slider 35 toward the substrate 40. The comb capacitor 41 includes one movable electrode 46, and first and second fixed electrodes 49 and 50 disposed to sandwich the movable electrode 46 from both side of a width direction thereof, and extends long outwardly from the stage 39. The movable electrode 46 includes: a support portion having a rigid-frame structure with its base end side fixed to the outer peripheral portion of the stage 39; and pluralities of comb-tooth portions 51 and 52 arrayed approximately at equal intervals in a direction in which the support portion extends to, protruding outward from the side edge portions of both sides of a width direction of the support portion. Note that, the movable electrode 46 is above the substrate 40, without contacting the same. The first and second fixed electrodes 49 and 50 are fixed to the substrate 40, and extend along the movable electrode 46 in a longitudinal direction of the movable electrode 46 on both sides of the width direction of the same. The first and second fixed electrodes 49 and 50 are disposed at equal intervals in their extending direction and at the equal height to that of the movable electrode 46, and respectively provided with pluralities of comb-tooth portions 53 and 54 protruding toward the comb-tooth portions 51 and 52.

The comb-tooth portions 51 and 53 are alternately arrayed in the extending direction of the movable electrode 46, and each comb-tooth portion is partially inserted between the two teeth portions of the opposite side. In addition, the comb-tooth portions 52 and 54 are alternately arrayed in the extending direction of the movable electrode 46, and each comb-tooth portion is partially inserted between the two teeth portions of the opposite side. Following the integral displacement of the comb-tooth portions 51 and 52 with the rotational displacement of the stage 39 around the anchor 38, changes occur in insertion amounts of the comb-tooth portions 51 and 52 between the comb-tooth portions 53 and the comb-tooth portions 54 respectively. If the change in the insertion amount of the comb-tooth portions 51 between the comb-tooth portions 53 is $\Delta$, then the change in the insertion amount of the comb-tooth portions 52 between the comb-tooth portions 54 becomes $-\Delta$.

Figure 6:
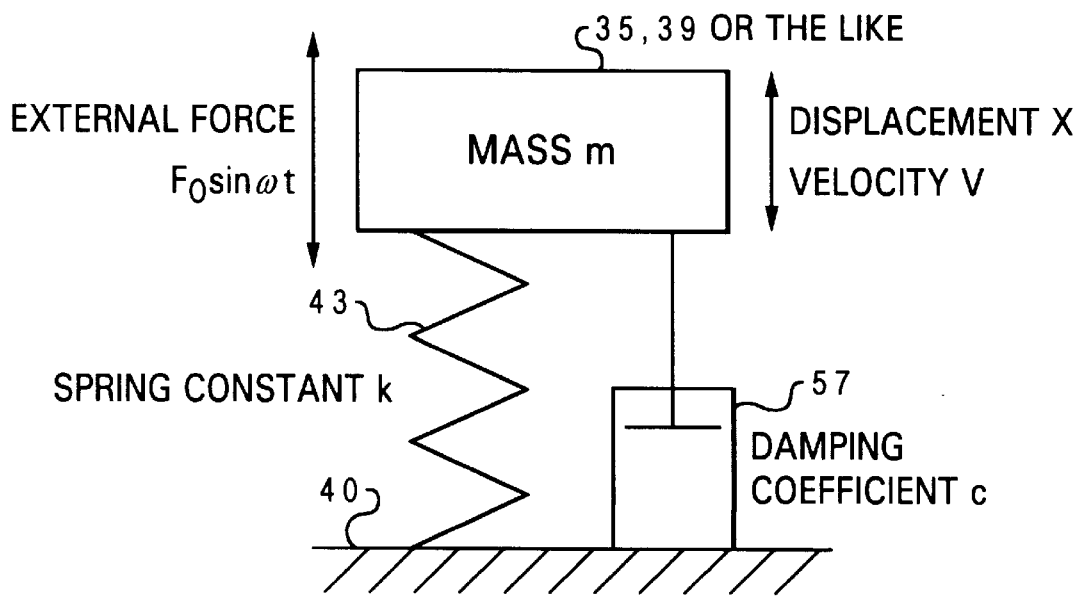
FIG. 6 is a view showing a mechanical equivalent model of the microactuator.

FIG. 6 shows a mechanical equivalent model of the microactuator 34. In the drawing, k represents a total spring constant of 24 plate springs in total provided in the microactuator 34; m represents a total mass of the stage 39 and all objects fixed thereto, that is, the slider 35 and the magnetic head 44; and c represents a damping coefficient of a damper 57 provided between the stage 39 and the substrate 40. In the microactuator 34, air between the comb-tooth portions 51 and 53 and between the comb-tooth portions 52 and 54 operates as the damper 57.

Figure 7:
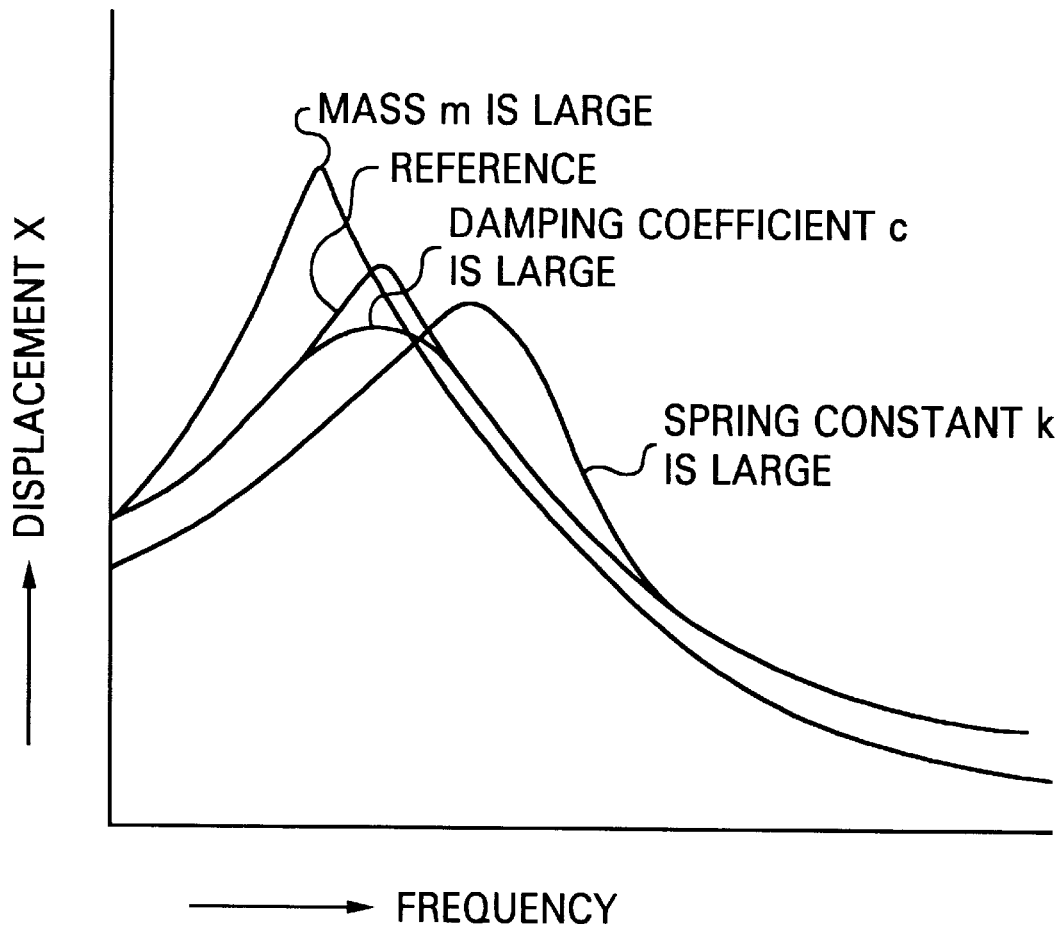
FIG. 7 is a view showing various frequency-displacement characteristics of the microactuator.

FIG. 7 shows various frequency-displacement characteristics of the microactuator 34. In FIG. 7, an abscissa indicates a frequency of vibration applied to the microactuator 34, and an ordinate indicates a rotational displacement x of the movable electrode 46 around the anchor 38 in the microactuator 34. Since the x is very small, the rotational displacement of the movable electrode 46 can be approximated to a linear displacement. A reference frequency-displacement characteristic indicates a good frequency-displacement characteristic of the microactuator 34. A frequency-displacement characteristic of the microactuator 34, in which m is not appropriate, has a peak of the displacement x too much higher than that of the reference frequency-displacement characteristic. A frequency-displacement characteristic of the microactuator 34, in which c is not appropriate, has a peak of the displacement x too much lower than that of the reference frequency-displacement characteristic. A frequency-displacement characteristic of the microactuator 34, in which k is not appropriate, has a frequency of the peak of the displacement x shifted to a side by more than a specified value than that of the frequency of the reference frequency-displacement characteristic. Note that, in FIG. 7, comparison is made between the reference frequency-displacement characteristic and frequency-displacement characteristics deviating from the reference. Similarly, comparison can be made between a reference frequency-velocity characteristic and frequency-velocity characteristics deviating from the reference.

Each of FIGS. 8(1) to (6) shows an equation for the mechanical characteristic of the mechanical equivalent model of the microactuator 34. Hereinafter, equations represented by respective numbers coincide with those in FIGS. 8(1) to 8(6), FIGS. 10(11) to 10(15), FIGS. 11(21) to 11(29), FIGS. 12(31) to 12(36), FIGS. 13(41) to 13(44), FIG. 14 and FIG. 15. In the drawings, fractions and square roots are clearly shown. An equation of motion for a primary free vibration system represented by the mechanical equivalent model of the microactuator 34 of FIG. 6 is as follows:

$$md/dt^2 \cdot (x^2) + Cd/dtx + kx = F_o \sin\omega t \quad (1)$$

The displacement x obtained in a steady state after a general solution is obtained by calculating the equation (1) and sufficient amount of time passes thereafter is as follows:

$$x = A \sin \omega t \quad (2)$$

Note that, the following is established:

$$A = (F_o/k)/[\{1-(\omega/\omega_n)^2\}^2 + (2\zeta/\omega_n)^2] \quad (3)$$

Velocity v is expressed as $$v = A\omega \cos \omega t \quad (4)$$

Here, an intrinsic angular frequency is $$\omega_n = (k/m) \quad (5),$$

and a damping ratio is $$\zeta = c/2(mk) \quad (6).$$

In the measuring method presented as the embodiment of the present invention, the device is determined to be a non-defective product if the frequency characteristic of the normal primary free vibration system has a shape similar to the reference shown in FIG. 7. Specifically, a basis for non-defective product determination is that a peak value and a frequency at a resonance point are in a prescribed range, and only one resonance point exists. Thus, individual calculation of the spring constant k, the mass m, and the damping coefficient c is not considered.

Figure 9:
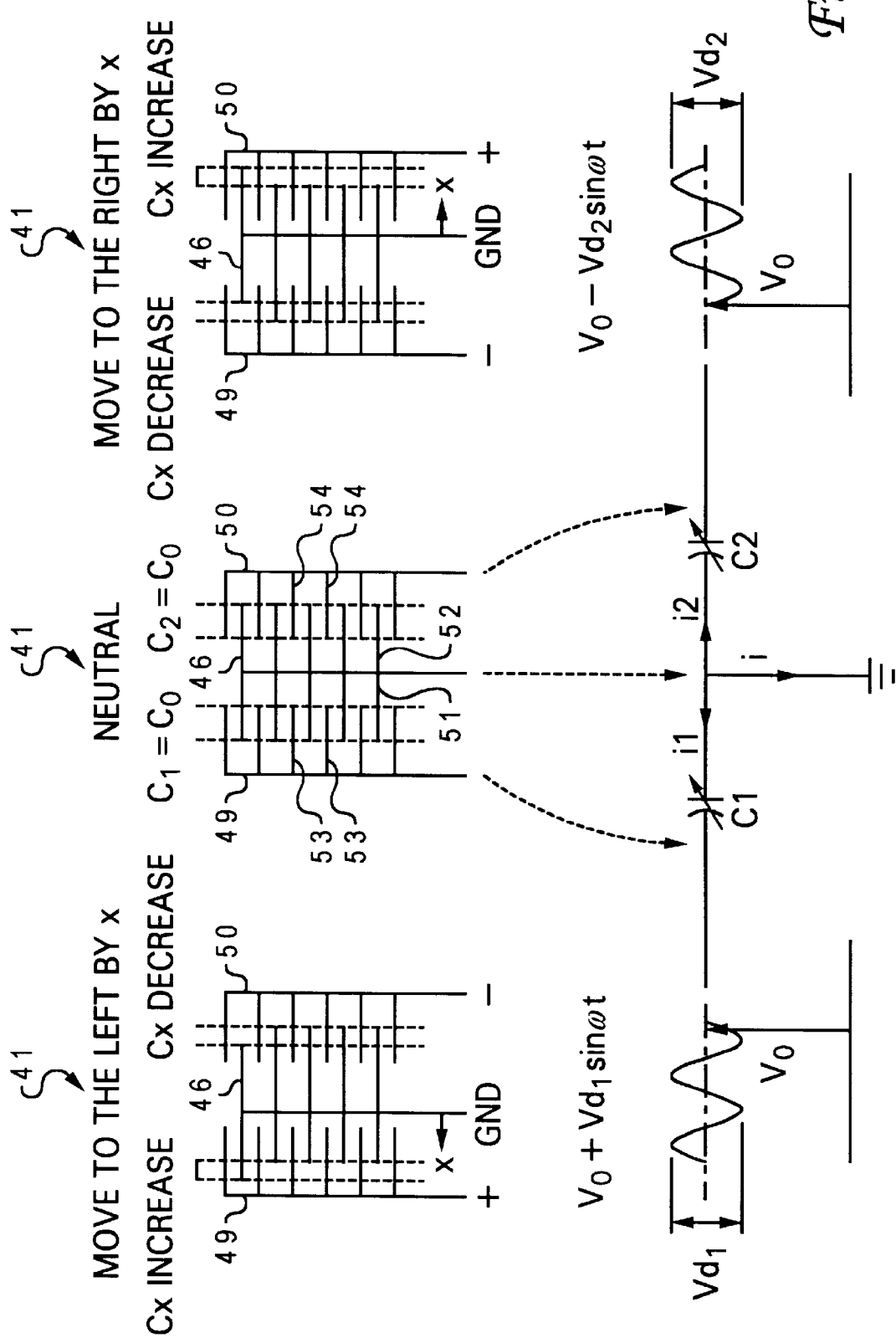
FIG. 9 is a view showing an electric equivalent circuit of the comb capacitor.

FIG. 9 shows an electric equivalent circuit of the comb capacitors 41. In the electric circuit, each of the comb capacitors 41 is expressed as capacitance $C_1$ and $C_2$. When being driven, inverted voltages to a bias voltage $V_o$ are applied to two driving electrodes, and the displacement x is given to each of the comb capacitors 41 by static electricity. This displacement also causes changes in each capacitance $C_1$ and $C_2$ in the equivalent circuit. Since the microactuator 34 is designed to be symmetrical in left and right, a reduction in one capacitance brings about an increase in the other, and amounts of the change are equal to each other.

A ground (GND) current as a current flowing in the movable electrode 46 is now analyzed. Hereinbelow, a calculation is performed to show an inclusion of a second harmonic content of the frequency of the applied voltage in a GND current i shown in FIG. 9. FIGS. 10(11) to 10(15), FIGS. 11(21) to 11(29), FIGS. 12(31) to 12(36), and FIGS. 13(41) to 13(44) respectively show equations for the electric equivalent circuit of the microactuator 34.

$$i = i_1 + i_2 = d/dtQ_1 + d/dtQ_2 = d/dt\{C_1(V_o + Vd_o \sin \omega t)\} + d/dt\{C_2(V_o - Vd_2 \sin \omega t)\} \quad (11)$$

Here, from FIG. 9, $C_1 = C_o - C_x$ (12) and $C_2 = C_o + C_x$ (13) are substituted.

$$i = d/dt\{(C_o - C_x)(V_o + Vd_1 \sin \omega t)\} + d/dt\{(C_o + C_x)(V_o - Vd_2 \sin \omega t)\} \quad (14)$$

$$= d/dt\{2C_oV_o + C_o(Vd_1 - Vd_2)\sin \omega t - C_x(Vd_1 + Vd_2)\sin \omega t\} \quad (15)$$

Meanwhile, since the quantity of capacitance change is proportional to the displacement x of the actuator, the amount of change $C_x$ is, from (2), $C_x = L_oA \sin \omega t$ (21). Note that, $L_o$ is a constant proportional to the height of the microactuator 34. Thus, equations (disk 11) are, $$i = d/dt\{2C_oV_o + C_o(Vd_1 - Vd_2)\sin \omega t - L_oA \sin \omega t(Vd_1 + Vd_2)\sin \omega t\} \quad (22),$$

$$= d/dt\{2C_oV_o + C_o(Vd_1 - Vd_2)\sin \omega t - L_oA(Vd_1 + Vd_2)\sin 2\omega t\} \quad (23).$$

In this case, a first term is expressed as $d/dt(2C_oV_o)=0$ (24); and a second term as $d/dt\{C_o(Vd_1-Vd_2)\sin \omega t\}$ (25), $= C_o(Vd_1-Vd_2)\omega \cos \omega t$ (26). A third term is expressed as $d/dt\{L_oA(Vd_1+Vd_2)\sin^2 \omega t\}$ (27), $=d/dt\cdot[\{L_oA(Vd_1+Vd_2)(1-\cos 2\omega t)\}/2]$ (28), $=\{L_oA(Vd_1+Vd_2)(2\omega)\sin(2\omega t)\}/2$ (29).

Thus, the GND current i is expressed as $$i = C_o(Vd_1-Vd_2)\omega \cos \omega t + \{L_o(Vd_1+Vd_2)A(2\omega)\sin(2\omega t)\}/2 \quad (31).$$

On the other hand, the velocity v of the microactuator 34 is expressed as $v = A\omega \cos \omega t$ as shown in the equation (4). Comparing the second term of the current i of the equation (31) to the velocity v, it is possible to understand that sin becomes cos (phase is advanced by 90 degrees), multiplication is made by a constant $Lo(Vd_1+Vd_2)/2$, and the frequency becomes the second harmonic ($2\omega$ t). The first term has a velocity dimension because the first term also contains $\omega \cos \omega t$. Thus, it is proved that the second term of the current i is the second harmonic of the velocity v, and is proportional to a sum of the height $L_o$ of the microactuator 34 and applied voltages ($Vd_1+Vd_2$).

Next, a frequency characteristic of the GND current is investigated. In order to obtain the frequency characteristic of the GND current represented by the equation (31), if division is made into a basic content $i_{base}$ and a second harmonic content $i_{2nd}$, $i_{base}=C_o(Vd_1-Vd_2)\omega \cos \omega t$ (32) and $i_{2nd}=L_o(Vd_1+Vd_2)A\omega \sin 2\omega t$ (33) are established. When $\cos \omega t=1$ and $\sin 2\omega t=1$ for a purpose of obtaining a maximum value, $$i_{base}=C_o(Vd_1-Vd_2)\omega \quad (34),$$

$$i_{2nd}=L_o(Vd_1+Vd_2)A\omega \quad (35),$$

$$=\{(F_o/k)L_o(Vd_1-Vd_2)\omega\}/[\{\{1-(\omega/\omega_n)^2\}^2+(2\zeta/\omega_n)^2] \quad (36), \text{ are established.}$$

The $i_{base}$ is a linear function, proportional to $C_o(Vd_1-Vd_2)$ (41). The $i_{2nd}$ becomes the largest at $\omega_o=(1-2\zeta^2)\omega_n$ (42). Note that, the intrinsic angular frequency is $\omega_n=(k/m)$ (43), and the damping ratio is $\zeta=c/\{2(mk)\}$.

Figure 14:
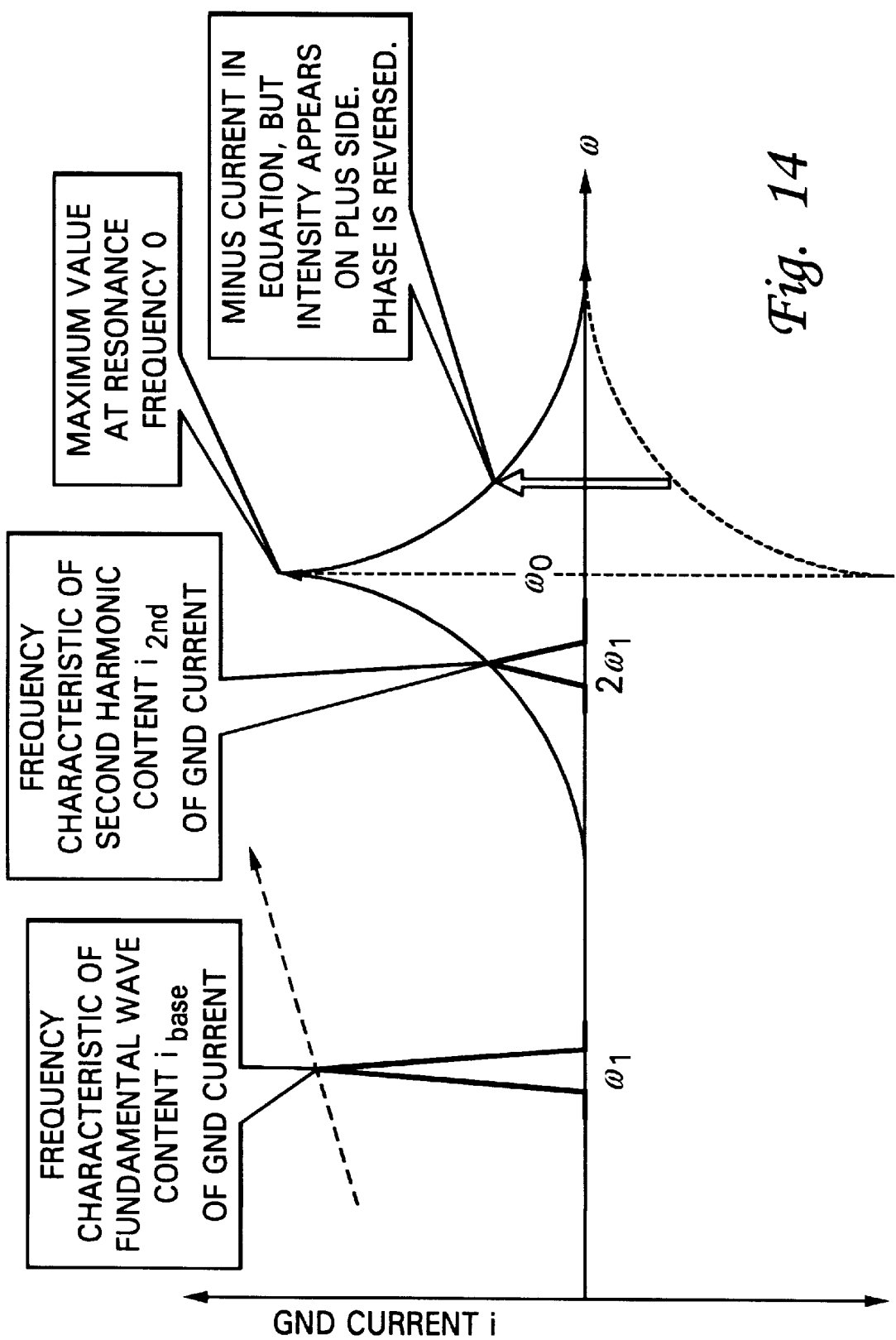
FIG. 14 is a graph showing a relation between an angular velocity ω and a GND current i calculated based on the electric equivalent circuit of the comb capacitor of FIG. 9.

FIG. 14 is a graph showing a relation between an angular velocity $\omega$ and the GND current i, calculated based on the electric equivalent circuit of the comb capacitors 41 of FIG. 9. When an abscissa indicates the angular velocity $\omega$, values of $i_{base}$ and $i_{2nd}$ become the ones shown in FIG. 14. Thus, measuring the current values of the fundamental wave and the harmonic content from an AC current value in each angular velocity $\omega$ by the fast Fourier transformer (FFT) while scanning the angular velocity $\omega$ of an AC drive voltage to the microactuator 34 and obtaining an angular velocity $\omega$-GND current i characteristic in a specified angular velocity range allow an assumption that characteristic lines like those shown in FIG. 14 can be obtained for $i_{base}$ and $i_{2nd}$. Note that, in FIG. 14, the GND current i is expressed as an absolute value.

Figure 15:
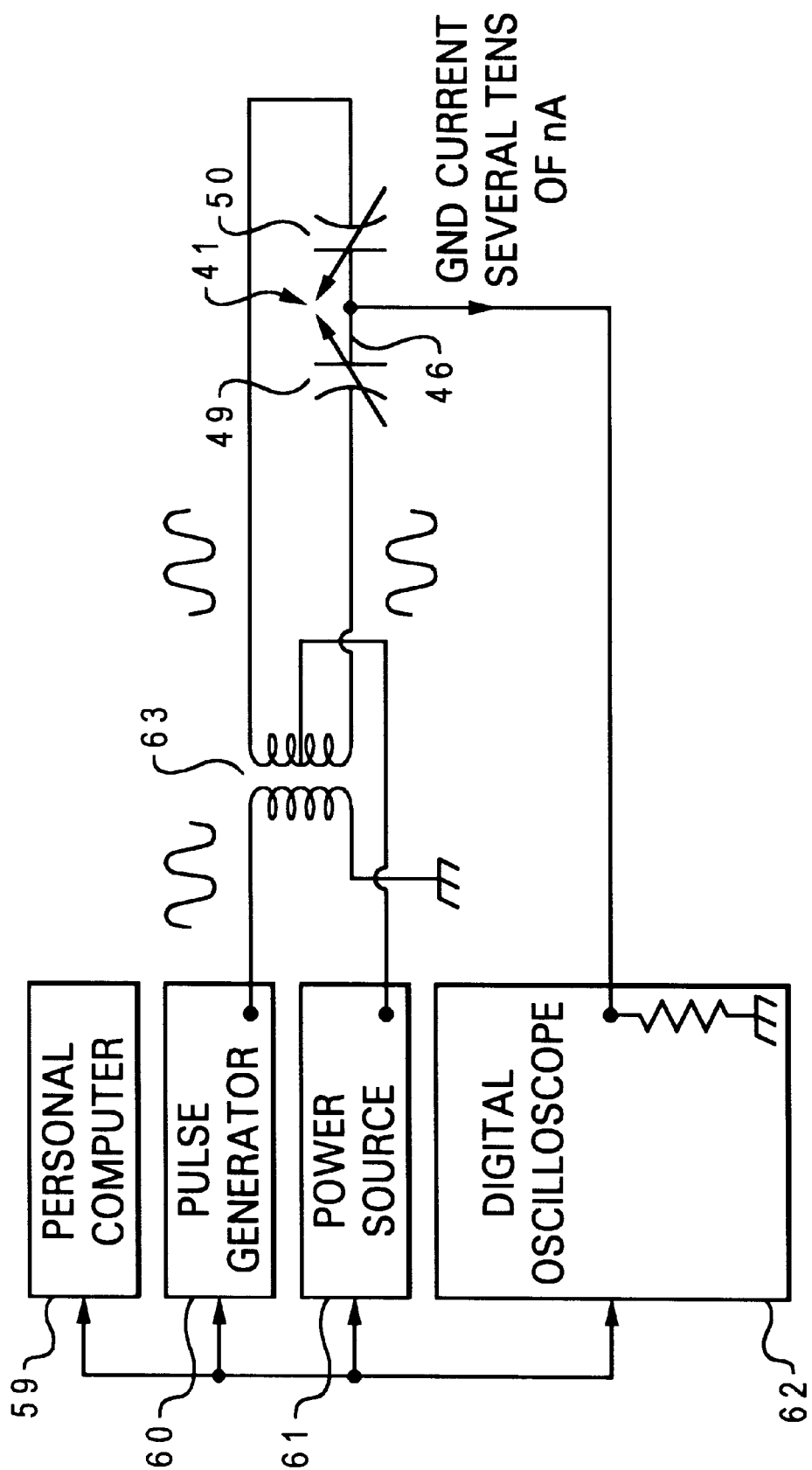
FIG. 15 is a schematic constitutional view of a test measuring device for detecting an angular velocity ω-GND current i characteristic of the microactuator.

Now, a test measuring device and measurement results of the GND current will be described. FIG. 15 is a schematic constitutional view showing a test measuring device for detecting an angular velocity ω-GND current i characteristic of the microactuator 34. This test measuring device includes a personal computer 59, a pulse generator 60, a power source 61, a digital oscilloscope 62, and a differential transformer 63. The pulse generator 60 outputs a sine wave alternating current of the angular velocity ω instructed by the personal computer 59 to the primary side of the differential transformer 63. The power source 61 applies a specified voltage to an intermediate tap on the secondary side of the differential transformer 63. The application of the sine wave alternating current from the pulse generator 60 to the primary side of the differential transformer 63 causes generation of a secondary sine wave alternating current at the same angular velocity as that of the primary side. This generated secondary sine wave alternating current has reverse polarity to that of the primary side. These currents are applied to the first and second fixed electrodes 49 and 50 of the comb capacitor 41. The movable electrode 46 of the comb capacitor 41 is connected to the input terminal of the digital oscilloscope 62. To measure the GND current of the movable electrode 46, a GND line of the microactuator 34 is connected to the input of the digital oscilloscope 62, and the GND current is converted into a voltage at an input resistance. The input resistance of the digital oscilloscope 62 is 1 MΩ, for example.

Calculation of a measured value shows that the GND current i is extremely small, as the resulting value is several tens of nA. However, conversion of the GND current into a voltage of about 100 mV at the input resistance enables FFT calculation to separate the same into frequency contents. In addition, realization of a practical system requires selection of the digital oscilloscope 62 capable for fast FFT calculation. To increase an SN ratio of the secondary harmonic, the fundamental wave content must be reduced. This reduction can be achieved by making a difference in Vpp of differential voltages small for stabilization. In the presented measuring device, an audio transformer is used as a differential transformer 63, in which temperature change is limited during differential voltage conversion, and a voltage difference is small. The personal computer 59 instructs the pulse generator 60 to increase the angular velocity co by a specified amount immediately after the digital oscilloscope 62 detects the current value of the second harmonic by the FFT. Accordingly, the angular velocity ω of the sine wave alternating current outputted from the pulse generator 60 increases by a specified amount from the lower limit to the upper limit of a specified range.

The frequency of the microactuator 34 to be measured is 100 kHz at the maximum even when the second harmonic is taken into consideration. The capacity of the microactuator 34 is also as small as 3 pF. Thus, a time constant is CR=3 pF×1 MΩ=3$10^{-6}$, and enough margin exists with respect to 100 kHz. If the frequency and the time constant come close to each other, however, a countermeasure is necessary, such as adding a high-resistance amplifier before the input terminal of the digital oscilloscope 62 without receiving the GND current at the input resistance 1 MΩ of the digital oscilloscope 62.

Figure 16:
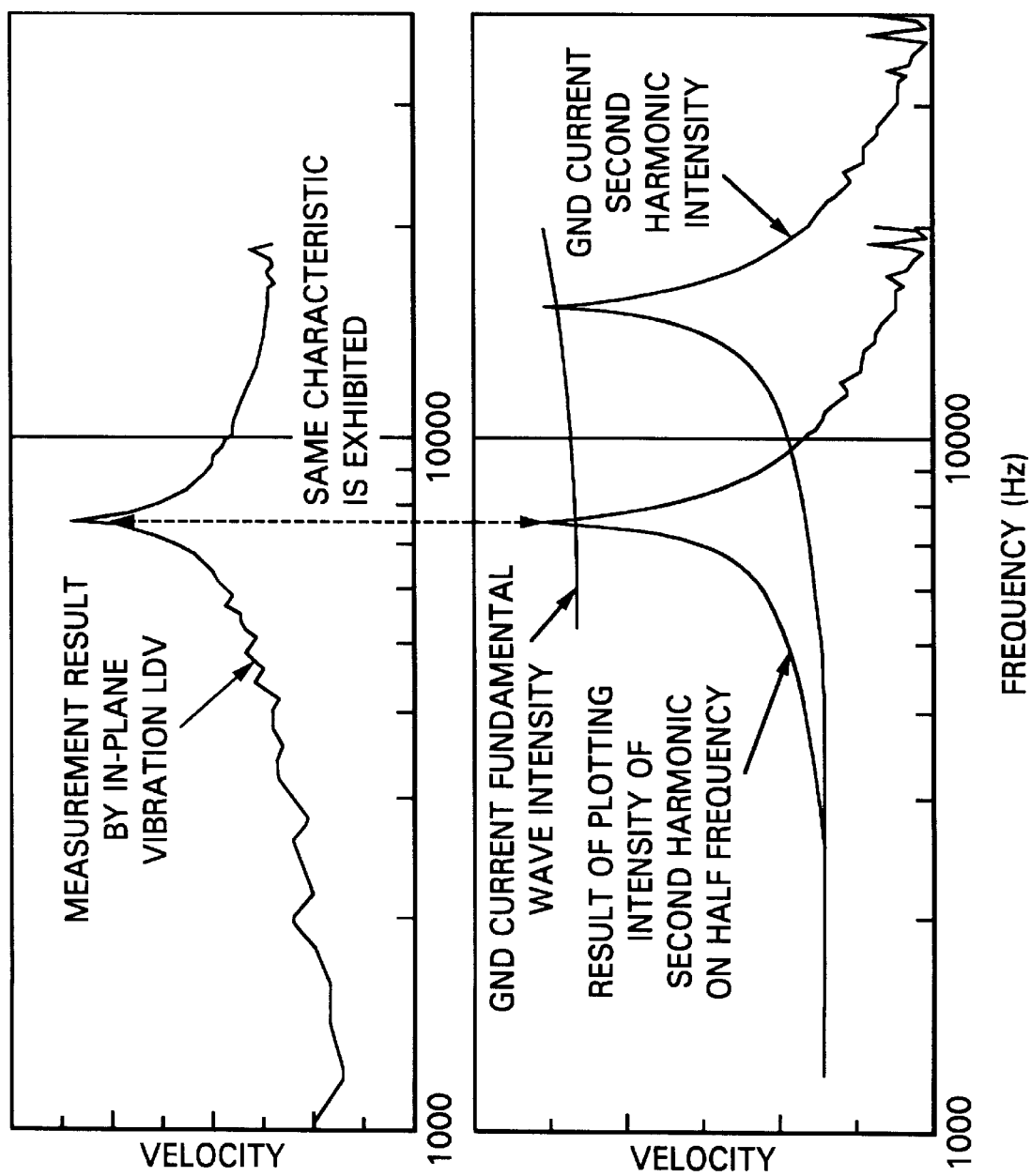
FIG. 16 is a view showing a comparison of a velocity-frequency characteristic of an experimental microactuator between a measurement result from a laser Doppler velocimeter LDV and a measurement result from a second harmonic FFT calculation of the GND current.

FIG. 16 shows comparison regarding the velocity-frequency characteristic of an experimental microactuator between the measurement result from the laser Doppler velocimeter LDV and the measurement result from the FFT calculation of the second harmonic of the GND current. A measured frequency ranges from 1.2 kHz to 20 kHz, and the second harmonic is distributed in a range of 2.44 kHz to 40 kHz. An applied voltage is 10+10 sin ωt[V]. In the measurement using the laser Doppler velocimeter, a resonance frequency of this actuator is 7.6 kHz. On the other hand, the second harmonic of the GND current has a resonance frequency at 15.2 kHz. The fundamental wave of the GND current is substantially flat in the entire measured frequencies. This indicates that $C_o(Vd_1-Vd_2)$ is extremely small in the equation (32).

The measurement result shown in FIG. 16 is identical to the characteristic shown in FIG. 14 obtained from the equation (31). Moreover, it is possible to understand that the characteristic of the second harmonic plotted on the point where the frequency is ½ (on the basic frequency) exhibits a good similarity to the measurement result from the LDV. Thus, it was confirmed that the method of obtaining a frequency-velocity resonance characteristic by measuring intensity of the second harmonic of the GND current of the microactuator 34 was correct.

As a final matter, it is important that while an illustrative embodiment of the present invention has been, and will continue to be, described in the context of a fully functional data processing system, those skilled in the art will appreciate that the software aspects of an illustrative embodiment of the present invention are capable of being distributed as a program product in a variety of forms, and that an illustrative embodiment of the present invention applies equally regardless of the particular type of signal bearing medium used to actually carry out the distribution. Examples of signal bearing media include recordable media such as floppy disks, hard disk drives, CD-ROMs, and transmission media such as digital and analog communication links.

Although the invention has been described with reference to specific embodiments, this description should not be construed in a limiting sense. Various modifications of the disclosed embodiments, as well as alternative embodiments of the invention, will become apparent to persons skilled in the art upon reference to the description of the invention. It is therefore contemplated that such modifications can be made without departing from the spirit or scope of the present invention as defined in the appended claims.

What is claimed is:

1. A method for inspecting a microactuator that comprises a capacitor having both poles thereof being freely displaced relative to each other with respect to an AC drive voltage and which displaces a specified object based on relative movements of both of the poles of said capacitor, said method comprising the steps of:

supplying the AC drive voltage to said capacitor while changing a frequency thereof within a specified range;

detecting a current value of a specified harmonic content of each frequency of the AC drive voltage from a current of said capacitor;

detecting a relationship between a frequency, fa, and a current value, I, of said specified harmonic content as a first electric characteristic, fa-I, of said microactuator; and determining whether a mechanical characteristic of said microactuator is good or bad based on the first electric characteristic, fa-I, of said microactuator.

2. The method of claim 1, wherein the specified harmonic content is a second harmonic content.

3. The method of claim 1, further comprising:

in the first electric characteristic, fa-I, converting the frequency, fa, into a frequency, fb, as fa(1/a multiple of a harmonic);

detecting a second electric characteristic, fb-I, at the same time with a current value of each fb regarded as a current value, I, of the fa corresponding to the fb; and wherein said determining whether a mechanical characteristic of said microactuator is good or bad is determined based on the second electric characteristic fb-I.

4. The method of claim 1, wherein the mechanical characteristic is a frequency-velocity characteristic.

5. The method of claim 1, wherein said step of determining whether a mechanical characteristic of said microactuator is good or bad includes comparing the mechanical characteristic corresponding to the first electric characteristic, fa-I, with a reference mechanical characteristic of said microactuator.

6. The method of claim 1, wherein:
said microactuator includes: a substrate, a stage rotatably supported on said substrate, and a plurality of said capacitors disposed at appropriate intervals along peripheries of said stage;
each of said capacitors includes fixed electrodes fixed to said substrate and a movable electrode fixed to the stage which is freely displaced relative to said fixed electrodes; and
change in the AC drive voltage to said capacitors causes said stage to change a rotational position thereof with respect to said substrate.

7. The method of claim 6, wherein:
said fixed and movable electrodes have pluralities of comb-tooth portions and are disposed in a manner that each comb-tooth portion is partially inserted between two adjacent comb-tooth portions of an opposite side, said method further comprising changing an amount of mutual insertion by controlling the AC drive voltage to said capacitor.

8. The method of claim 7, wherein each of said capacitor includes one movable electrode and two fixed electrodes disposed to sandwich said movable electrode from both sides of a displacing direction of the movable electrode.

9. The method of claim 1, wherein:
said capacitor is installed in a hard disk device, said hard disk device including: a suspension with a base end side thereof being supported to allow a tip side to freely move in a radial direction of a disk, the disk being a recording medium; and a gimbal having a base end portion attached to the tip portion of the suspension;
said microactuator having said substrate fixed to the tip portion of said gimbal, a slider fixed to a stage of said microactuator; and a magnetic head as said specified object to be displaced integrally with said stage.

10. A mechanism for inspecting a microactuator that comprises a capacitor having both poles thereof being freely displaced relative to each other with respect to an AC drive voltage, and which displaces a specified object based on relative movements of both of the poles of the capacitor, said mechanism comprising:
drive voltage supplying means for supplying the AC drive voltage to said capacitor while changing a frequency thereof within a specified range;
current value detecting means for detecting a current value regarding a specified harmonic content with respect to each frequency of the AC drive voltage from a current of said capacitor;
first electric characteristic detecting means for detecting a relation between a frequency fa and a current value I of said specified harmonic content as a first electric characteristic fa-I of said microactuator; and
determining means for determining whether a mechanical characteristic of said microactuator is good or bad based on the first electric characteristic fa-I of said microactuator.

11. The mechanism of claim 10, wherein the specified harmonic content is a second harmonic content.

12. The mechanism of claim 10, further comprising:
second electric characteristic detecting means for converting the frequency fa of the first electric characteristic, fa-I, into a frequency fb calculated as fa(1/a multiple of a harmonic), and at the same time, detecting a second electric characteristic, fb-I, with a current value of each fb regarded as a current value I of the fa corresponding to the fb; and
wherein said determining means determines whether a mechanical characteristic of said microactuator is good or bad based on the second electric characteristic fb-I.

13. The mechanism of claim 10, wherein the mechanical characteristic is a frequency-velocity characteristic.

14. The mechanism of claim 10, wherein said determining means determines whether the mechanical characteristic of said microactuator is good or bad by comparing the mechanical characteristic corresponding to the first electric characteristic fa-I with a reference mechanical characteristic of said microactuator.

15. The mechanism of claim 10, wherein said microactuator includes:
a substrate;
a stage rotatably supported on the substrate;
and a plurality of said capacitors disposed at appropriate intervals along peripheries of the stage, wherein each of said capacitors includes fixed electrodes fixed to said substrate, and a movable electrode fixed to said stage, which is freely displaced relative to said fixed electrodes; and
wherein a change in the AC drive voltage to said capacitors causes said stage to change a rotational position thereof with respect to said substrate.

16. The mechanism of claim 15, wherein said fixed and movable electrodes have pluralities of comb-tooth portions and are disposed in a manner that each comb-tooth portion is partially inserted between two adjacent comb-tooth portions of an opposite side, and an amount of mutual insertion is changed by control of the AC drive voltage to said capacitor.

17. The mechanism of claim 16, wherein each of said capacitor includes one movable electrode and two fixed electrodes disposed to sandwich said movable electrode from both sides of a displacing direction of the movable electrode.

18. The mechanism of claim 10, wherein:
said capacitor is installed in a hard disk device, the hard disk device including: a suspension with a base end side thereof being supported to allow a tip side to freely move in a radial direction of a disk, the disk being a recording medium; a gimbal having a base end portion attached to the tip portion of the suspension;
said microactuator having said substrate fixed to a tip portion of said gimbal, a slider fixed to a stage of said microactuator, and a magnetic head as said specified object to be displaced integrally with said stage.

* * * * *